United States Patent
Shiota et al.

(10) Patent No.: US 12,218,476 B2
(45) Date of Patent: Feb. 4, 2025

(54) TERMINAL BLOCK CONFIGURED TO ELECTRICALLY RELAY THROUGH PARTITION WALL SEALING A LIQUID

(71) Applicant: YAZAKI CORPORATION, Tokyo (JP)

(72) Inventors: Kazushige Shiota, Makinohara (JP); Masato Akino, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 345 days.

(21) Appl. No.: 17/943,938

(22) Filed: Sep. 13, 2022

(65) Prior Publication Data

US 2023/0078301 A1    Mar. 16, 2023

(30) Foreign Application Priority Data

Sep. 16, 2021 (JP) ................. 2021-151568

(51) Int. Cl.
*H01R 9/26* (2006.01)
*H01R 25/16* (2006.01)
*H05K 5/06* (2006.01)

(52) U.S. Cl.
CPC ......... *H01R 9/2675* (2013.01); *H01R 9/2608* (2013.01); *H01R 25/16* (2013.01); *H05K 5/069* (2013.01)

(58) Field of Classification Search
CPC .... H01R 9/2675; H01R 9/2608; H01R 25/16; H01R 5/069
USPC ........................................ 439/578, 709, 801
See application file for complete search history.

(56) References Cited

U.S. PATENT DOCUMENTS

| 8,342,880 B2* | 1/2013 | Kato ................. H01R 13/4226 |
| | | 439/382 |
| 8,449,323 B2* | 5/2013 | Omae ................. H01R 13/648 |
| | | 439/607.35 |
| 9,083,107 B2* | 7/2015 | Suzuki ............... H01R 13/5202 |
| 2019/0104634 A1 | 4/2019 | Hasija et al. |
| 2021/0036457 A1 | 2/2021 | Aoki et al. |
| 2021/0104859 A1 | 4/2021 | Sakakura et al. |

FOREIGN PATENT DOCUMENTS

| JP | 2003-272754 A | 9/2003 |
| JP | 2017-157286 A | 9/2017 |
| JP | 2019-71271 A | 5/2019 |
| JP | 2021-22493 A | 2/2021 |

* cited by examiner

*Primary Examiner* — Phuong K Dinh
(74) *Attorney, Agent, or Firm* — Sughrue Mion, PLLC (57) ABSTRACT

A terminal block electrically relays inside and outside of a partition wall sealing a liquid. The terminal block includes a housing disposed so as to penetrate the partition wall, a bus bar inserted into the housing, a seal member attached to the housing so as to seal a gap between the bus bar and the housing, and a holder assembled to the housing outside the partition wall with respect to the seal member so as to prevent the seal member from coming off. The bus bar extends across the inside and outside of the partition wall through a first through hole of the housing, a seal hole of the seal member, and a second through hole of the holder. Durability of a material constituting the housing to the liquid is better than durability of a material constituting the holder to the liquid.

4 Claims, 5 Drawing Sheets

TERMINAL BLOCK CONFIGURED TO ELECTRICALLY RELAY THROUGH PARTITION WALL SEALING A LIQUID

CROSS-REFERENCE TO RELATED APPLICATIONS

This application is based on and claims priority under 35 USC 119 from Japanese Patent Application No. 2021-151568 filed on Sep. 16, 2021, the contents of which are incorporated herein by reference.

TECHNICAL FIELD

The present invention relates to a terminal block, that electrically relays inside and outside of a partition wall that seals a liquid.

BACKGROUND ART

In the related art, a terminal block to be mounted on a case or the like of devices mounted on a vehicle has been proposed. For example, one of terminal blocks in the related art includes a housing assembled to an outer wall (partition wall) of a device incorporating a motor or the like, a bus bar inserted into the housing, and a packing sealing a gap between the housing and the bus bar, and electrically relays inside and outside of the outer wall of the device while preventing leakage of an oil liquid or the like sealed in the device.

CITATION LIST

Patent Literature

Patent Literature 1: JP-2019-071271-A

SUMMARY OF INVENTION

In the terminal block of the type described above, the housing to be exposed to the oil liquid or the like is generally made of a material (for example, a polyamide resin or the like) having excellent durability to the oil liquid or the like in order to suppress corrosion, denaturation, or the like due to the oil liquid or the like sealed inside the device. However, since the resin having excellent durability to the oil liquid or the like is generally expensive, use of such a resin is a factor for increasing a manufacturing cost of the housing (and a manufacturing cost of the terminal block).

An object of the present invention is to provide a terminal block capable of reducing a manufacturing cost while improving durability to a liquid to which the terminal block is to be exposed.

In order to achieve the above object, a terminal block according to the present invention is characterized as follows.

A terminal block configured to electrically relay inside and outside of a partition wall sealing a liquid includes:
  a housing disposed so as to penetrate the partition wall;
  a bus bar inserted into a first through hole formed in the housing;
  a seal member attached to the housing so as to seal a gap between the bus bar and the housing, and having a seal hole through which the bus bar is inserted; and
  a holder assembled to the housing at a position outside the partition wall with respect to the seal member so as to prevent the seal member from coming off, and having a second through hole through which the bus bar is inserted.

The bus bar extends through the first through hole, the seal hole, and the second through hole such that one end of the bus bar is disposed inside the partition wall and the other end of the bus bar is disposed outside the partition wall, and durability of a material constituting the housing to the liquid is better than durability of a material constituting the holder to the liquid.

According to the terminal block of the present invention, since the housing is disposed so as to penetrate the partition wall (for example, an outer wall of a device such as a motor), the housing to be exposed to the liquid (for example, an oil liquid or water) sealed in the partition wall is made of the material having better durability to the liquid as compared with the holder. Since the holder is assembled to the housing at the position outside the partition wall with respect to the seal member, the holder is not exposed to the liquid inside the partition wall and does not necessarily have the excellent durability to the liquid. The bus bar extends across the inside and outside of the partition wall through the first through hole of the housing, the seal hole of the seal member, and the second through hole of the holder, which are disposed as described above. By selecting the material constituting the housing and the material constituting the holder separately from a viewpoint of a degree of durability to the liquid inside the partition wall, a manufacturing cost of the terminal block can be reduced as compared with a case where both the housing and the holder are made of a material having excellent durability to the liquid as in the related art. Therefore, the terminal block of the present configuration can reduce the manufacturing cost while improving the durability to the liquid to which the terminal block is exposed.

The degree of durability of the housing and the holder to the liquid can be evaluated in accordance with, for example, a liquid resistance test method defined in JISK6258 or a liquid resistance test method defined in JISK7114.

The present invention has been briefly described above. Further, details of the present invention will be clarified by reading a mode (hereinafter, referred to as "embodiment") for carrying out the invention to be described below with reference to the accompanying drawings.

DESCRIPTION OF EMBODIMENTS

Embodiment

Hereinafter, an example of an embodiment according to the present invention will be described with reference to the drawings.

Figure 1:
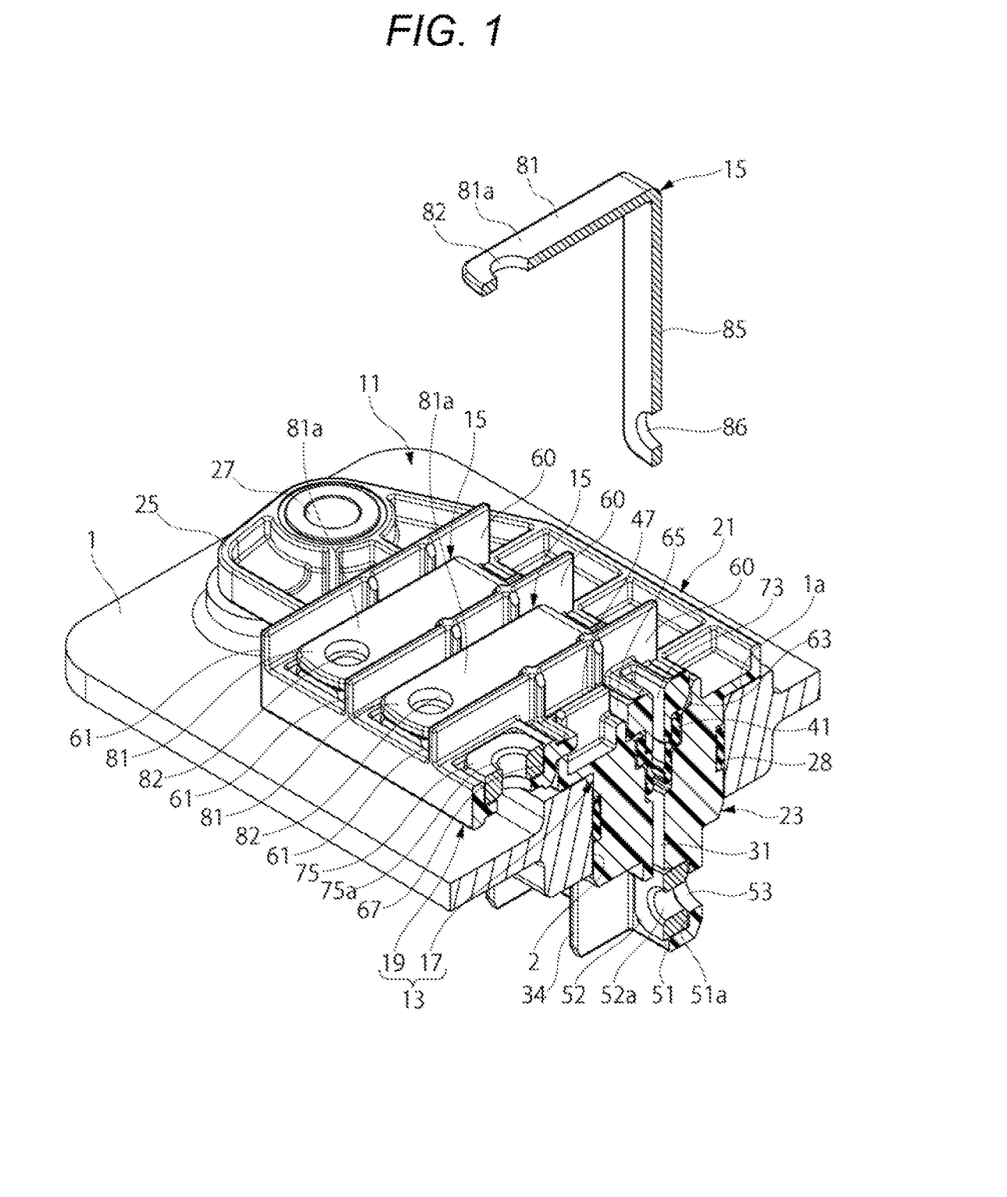
FIG. 1 is a perspective view of a terminal block according to the present embodiment in a vertical cross-sectional view.
Figure 2:
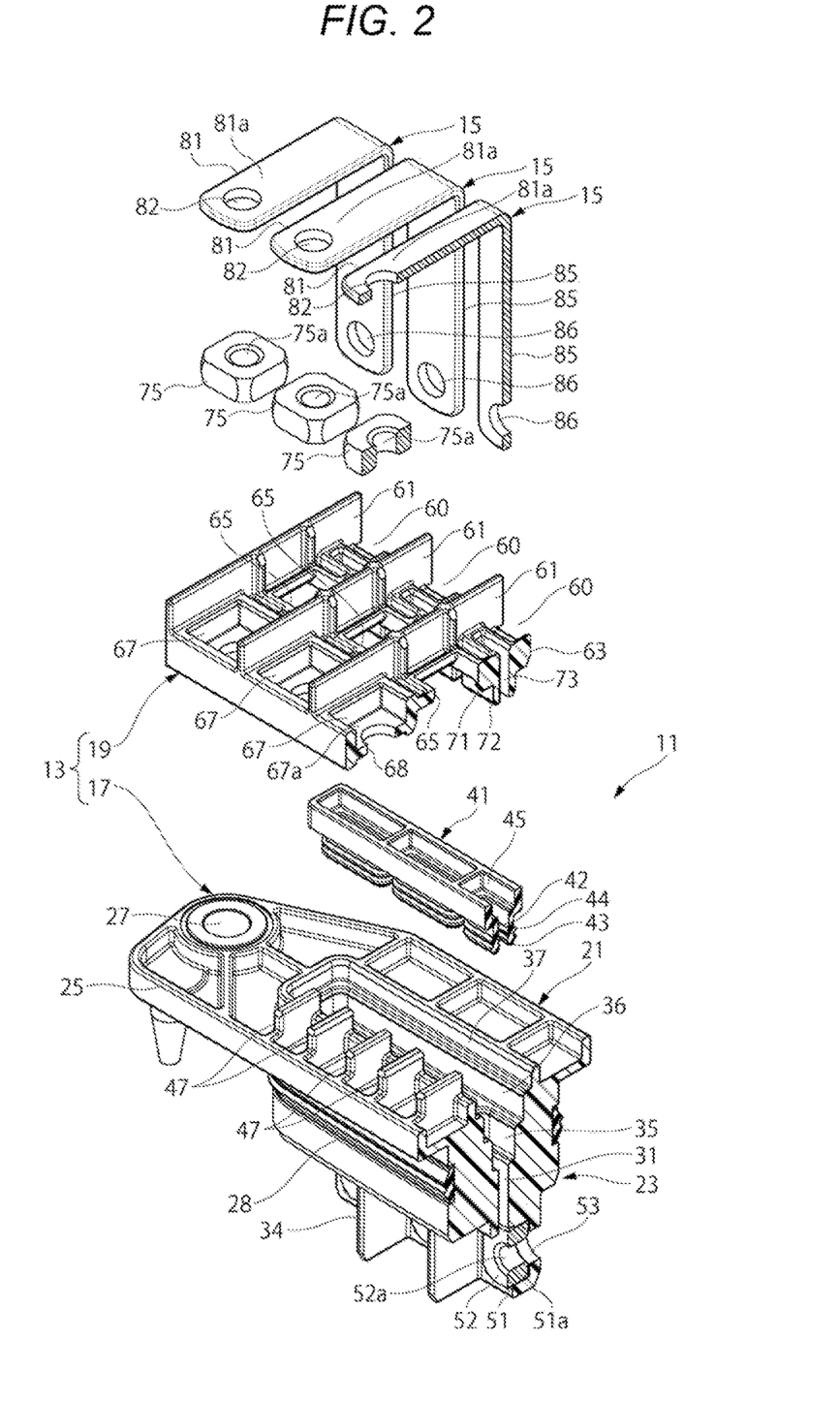
FIG. 2 is, an exploded perspective view of the terminal block according to the present embodiment in the vertical cross-sectional view.
Figure 3:
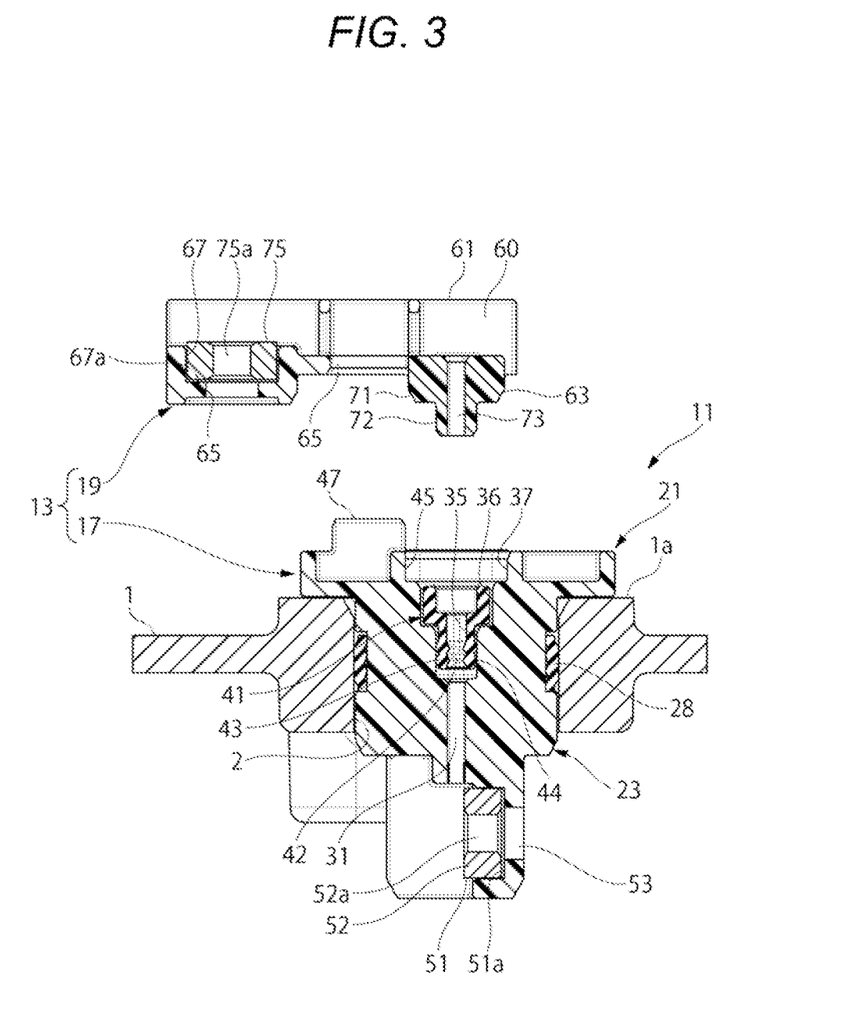
FIG. 3 is a cross-sectional view taken along a vertical direction of a housing in a state in which a housing body and a holder are separated.
Figure 4:
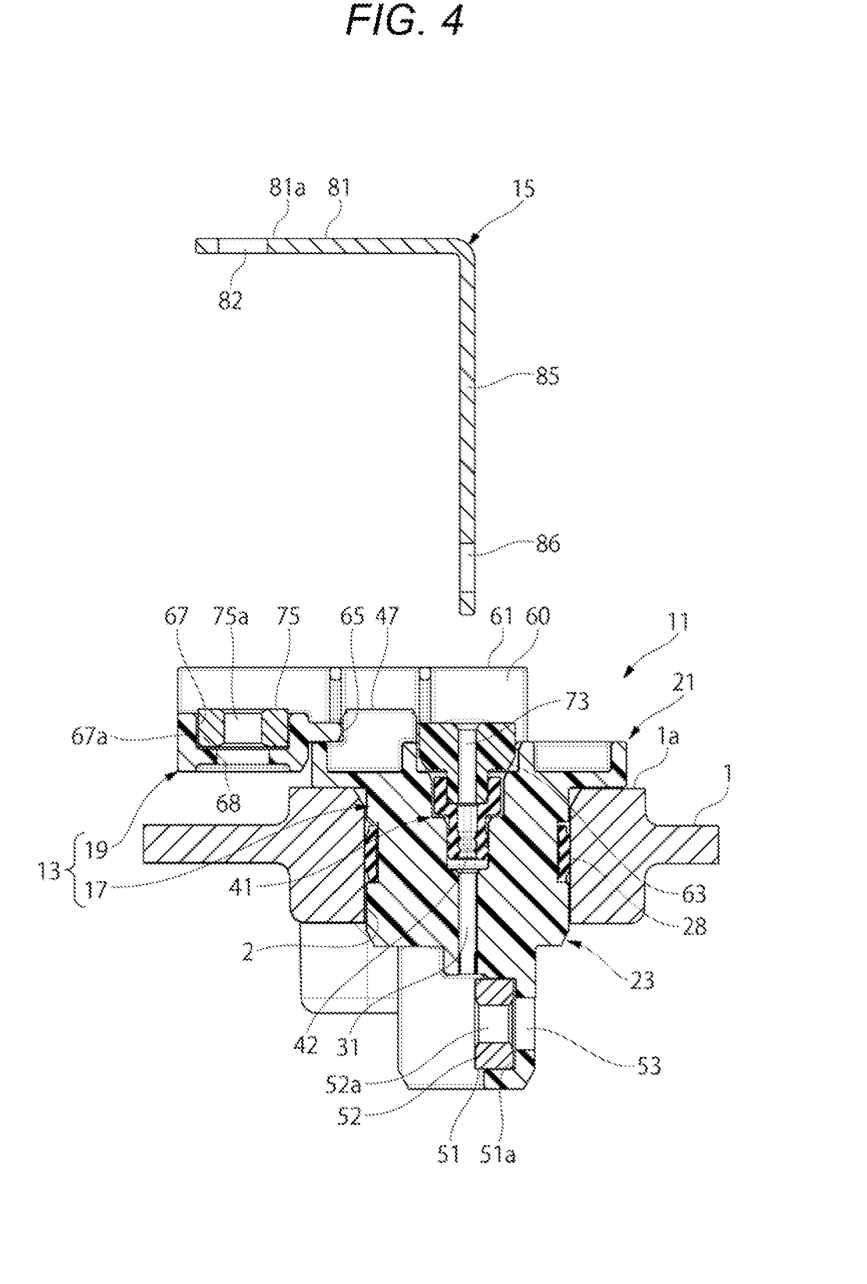
FIG. 4 is a cross-sectional view taken along the vertical direction of the housing in a state in which terminals are removed.
Figure 5:
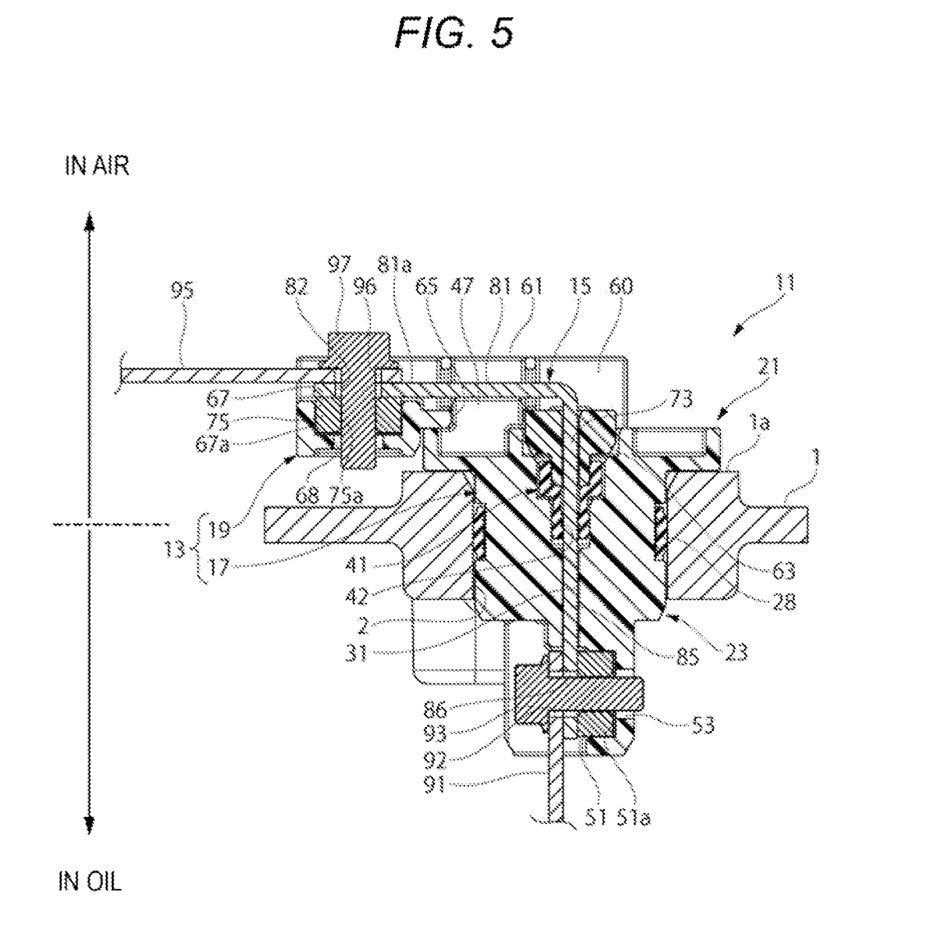
FIG. 5 is a cross-sectional view taken along the vertical direction of the terminal block.

FIG. 1 is a perspective view of a terminal block according to the present embodiment in a vertical cross-sectional view. FIG. 2 is an exploded perspective view of the terminal block according to the present embodiment in the vertical cross-sectional view. FIG. 3 is a cross-sectional view taken along a vertical direction of a housing in a state in which a housing body and a holder are separated. FIG. 4 is a cross-sectional view taken along the vertical direction of the housing in a state in which terminals are removed. FIG. 5 is a cross-sectional view taken along the vertical direction of the terminal block.

As illustrated in FIGS. 1 to 5, a terminal block 11 according to the present embodiment includes a housing 13 and a plurality of terminals 15. The housing 13 includes a housing body 17 and a holder 19. The housing body 17 and the holder 19 are each formed of an insulating resin. The holder 19 is assembled to an upper portion of the housing body 17 to form the housing 13.

An upper side of the housing body 17 is a fastening portion 21, and a lower side of the housing body 17 is an assembling portion 23. The housing body 17 has a flange portion 25 protruding to an outer peripheral side, and a bolt through hole 27 is formed in the flange portion 25.

In the terminal block 11, the assembling portion 23 of the housing 13 is fitted into an attachment hole 2 formed in a partition wall (outer wall) 1 of a device such as a drive motor. Then, in this state, a bolt (not illustrated) passes through the bolt through hole 27 of the flange portion 25 of the housing body 17 and is screwed into a screw hole (not illustrated) formed in the partition wall 1, whereby the terminal block 11 is assembled in a state of being in contact with an attached surface 1a of the partition wall 1. An oil liquid for lubrication and the like of components built in the partition wall 1 is sealed inside the partition wall 1 (see FIG. 5).

An annular seal member 28 is mounted on the housing body 17 on an assembling portion 23 side in a circumferential direction. The seal member 28 seals a space between the assembling portion 23 and an inner peripheral surface of the attachment hole 2 when the assembling portion 23 of the housing 13 is fitted into the attachment hole 2.

The housing body 17 has a plurality of terminal through holes 31 penetrating the housing body 17 from the front to the back. The housing body 17 has a nut accommodating recessed portion 51, which is a recessed portion having a rectangular shape m a plan view, on the assembling portion 23 side. A side of the nut accommodating recessed portion 51 is open. A nut 52 having the rectangular shape in the plan view and having a screw hole 52a is accommodated in the nut accommodating recessed portion 51 from the side. A counterbore 53 is formed in a bottom portion 51a of the nut accommodating recessed portion 51. A partition wall 34 is formed between the nut accommodating recessed portions 51, and the adjacent nut accommodating recessed portions 51 are partitioned by the partition wall 34. The nut 52 may be integrated with the housing body 17 by insert molding.

A seal fitting hole portion 35 is formed in an upper portion of the terminal through hole 31 in the housing body 17. The housing body 17 has a seal holding recessed portion 36 in which each seal fitting hole 35 opens, and further has a fitting recessed portion 37 above the seal holding recessed portion 36, The seal holding recessed portion 36 and the fitting recessed portion 37 are formed along a width direction of the housing body 17.

A seal member 41 is fitted into the seal holding recessed portion 36 from above. The seal member 41 is formed of, for example, a flexible resin material such as rubber, and has a plurality of seal holes 42. Further, the seal member 41 is formed with a plurality of seal tubular portions 43 protruding in a fitting direction into the seal holding recessed portion 36, and the seal holes 42 are formed in the seal tubular portions 43. Lip portions 44 are formed on outer peripheries of the seal tubular portions 43. When the seal member 41 is fitted into the seal holding recessed portion 36 of the housing body 17, each seal tubular portion 43 is fitted into the seal fitting hole 35. Accordingly; the lip portion 44 of each seal tubular portion 43 is brought into close contact with an inner peripheral surface of the seal fitting hole portion 35 to seal the seal fitting hole portion 35. An engagement recessed portion 45 is formed in the seal member 41 on an upper portion of the seal hole 42.

A plurality of support walls 47 are erected on an upper portion of the housing body 17. The support walls 47 are formed in pairs corresponding to the terminal through holes 31. The support walls 47 are arranged along an arrangement direction of the terminal through holes 31 and protrude to an upper side of the housing body 17.

The holder 19 includes a plurality of terminal holding portions 60. Partition walls 61 are formed on both sides of the terminal holding portions 60, and the terminal holding portions 60 are partitioned by the partition walls 61. Each terminal holding portion 60 is provided with a terminal insertion portion 63, an insertion window 65, and a nut accommodating recessed portion 67 in order.

The terminal insertion portion 63 includes a plurality of fitting protruding portions 71 protruding downward. A seal holding protruding portion 72 is formed on the fitting protruding portion 71. Terminal insertion holes 73 penetrating the holder 19 from the front to the back are formed in the holder 19 at positions where the fitting protruding portions 71 and the seal holding protruding portions 72 are formed. When the holder 19 is assembled to the upper portion of the housing body 17, the fitting protruding portion 71 is fitted to the fitting recessed portion 37 of the housing body 17, and the seal holding protruding portion 72 is fitted to the engagement recessed portion 45 of the seal member 41. Accordingly, the seal member 41 is pressed and held in the terminal through hole 31 by the holder 19 assembled to the housing body 17. That is, the holder 19 prevents a positional deviation of the seal member 41 (that is, prevents the seal member 41 from coming off). In this state, the terminal insertion hole 73 of the holder 19 communicates with the terminal through hole 31 of the housing body 17 and the seal hole 42 of the seal member 41.

The holder 19 does not necessarily have to press the seal member 41 as long as the holder 19 can prevent the seal member 41 from coming. For example, the holder 19 may be disposed in a state in which the holder 19 and the seal member 41 are adjacent to each other without a gap therebetween (a so-called zero-touch state), may be disposed such that another component is sandwiched between the holder 19 and the seal member 41 and the seal member 41 is pressed with the component, or ma be disposed such that another component is sandwiched between the holder 19 and the seal member 41 and the component is M the zero-touch state with the seal member 41.

The insertion window 65 is formed of an opening penetrating the insertion window 65 from the front to the back, and is formed in a rectangular shape in the plan view. By assembling the holder 19 to the upper portion of the housing body 17, every pair of the support walls 47 formed on the housing body 17 are inserted into the corresponding one of the insertion windows 65. An upper end of the support wall 47 inserted into the insertion window 65 slightly protrudes in the terminal holding portion 60 between the partition walls 61 of the holder 19.

The nut accommodating recessed portion 67 is a recessed portion whose upper side is open, and is formed in a rectangular shape in the plan view, A nut (fastening member) 75 having a rectangular shape in the plan view and having a screw hole 75a is accommodated in the nut accommodating recessed portion 67 from above. The nut accommodating recessed portion 67 has an inner shape slightly larger than an outer shape of the nut 75. A counterbore 68 is formed in a bottom portion 67a of the nut accommodating recessed portion 67. The nut 75 may be integrated with the holder 19 by insert molding.

The terminal 15 mounted on the housing 13 is formed of a conductive metal material such as copper or a copper alloy, and is a plate-shaped bus bar. The terminal 15 is bent in the vicinity of one end portion thereof, and is formed in an L shape in a side view. One end side of the terminal 15 is a fastening plate portion 81, and the other end side is a connection plate portion 85, with a bent portion as a boundary. A fastening hole 82 is formed in the fastening plate portion 81, and a connection hole 86 is formed in the connection plate portion 85.

The terminal 15 is mounted on the housing 13 by inserting the connection plate portion 85 into the terminal insertion hole 73 and the terminal through hole 31 that communicate with each other in a state in which the fastening plate portion 81 faces the nut accommodating recessed portion 67 in which the nut 75 of the holder 19 is accommodated.

Then, the connection plate portion 85 of the terminal 15 is inserted into the seal hole 42 of the seal member 41 between the housing body 17 and the holder 19. Accordingly, an inner peripheral surface of the seal hole 42 of the seal member 41 is brought into close contact with an outer peripheral surface of the connection plate portion 85 of the terminal 15, and a gap between the connection plate portion 85 of the terminal 15 and the terminal through hole 31 is sealed.

When the terminal 15 is mounted on the housing 13, the fastening, plate portion 81 is disposed at a position facing the nut 75 accommodated in the nut accommodating recessed portion 67, and an end portion of the connection plate portion 85 is disposed at a position facing the nut 52 accommodated in the nut accommodating recessed portion 51. Accordingly, in the terminal 15, the fastening hole 82 of the fastening plate portion 81 communicates with the screw hole 75a of the nut 75, and the connection hole 86 of the connection plate portion 85 communicates with the screw hole 52a of the nut 52.

Further, the fastening, plate portion 81 of the terminal 15 mounted on the housing 13 is brought into contact with the upper end of the support wall 47 of the housing body 17. Accordingly, a fastening surface 81a on an upper surface of the fastening plate portion 81 of the terminal 15 is positioned.

In the above description, the seal member 41, the holder 19, and the terminals 15 are assembled to the housing body 17 in order and individually. According to this assembling order, since the terminal 15 enters the seal hole 42 of the seal member 41 while being guided by the terminal insertion hole 73 of the holder 19, it is possible to prevent the terminal 15 from erroneously coming into contact with the engagement recessed portion 45 or the like of the seal member 41 and damaging the seal member 41. However, the assembly order of the seal member 41, the holder 19, and the terminal 15 on the housing body 17 is not limited thereto, and for example, the seal member 41 may be assembled to the housing body 17, the terminal 15 may be assembled to the holder 19, and the holder 19 to which the terminal 15 is assembled may be assembled to the housing body 17 to which the seal member 41 is assembled.

Next, a method of wiring to the terminal block 11 will be described.

In the terminal block 11, a terminal fitting 91 provided in a wiring material on a device side to which the terminal block 11 is attached is connected to the connection plate portion 85 of the terminal 15. A hole portion 92 is formed in the terminal fitting 91. In order to connect the terminal fitting 91 to the connection plate portion 85 of the terminal 15, a bolt 93 is inserted into the hole portion 92 formed in the terminal fitting 91, and the bolt 93 passes through the connection hole 86 of the connection plate portion 85 of the terminal 15 and is screwed into the screw hole 52a of the nut 52 accommodated in the nut accommodating recessed portion 51. Accordingly, the terminal fitting 91 is fastened and connected to the connection plate portion 85 of the terminal 15 by the bolt 93 and the nut 52. In this fastened state, an end portion of the bolt 93 passes through the counterbore 53 formed in the bottom portion 51a without interfering with the bottom portion 51a of the nut accommodating recessed portion 51.

Further, in the terminal block 11, a bus bar 95, which is a wiring material on a device side of a connection counterpart, is connected to the fastening plate portion 81 of the terminal 15. The bus bar 95 is a plate member formed of a conductive metal material, and has a hole portion 96 on a tip end portion thereof. In order to connect the bus bar 95 to the fastening plate portion 81 of the terminal 15, a bolt 97 is inserted into the hole portion 96 formed in the bus bar 95, the bolt 97 passes through the fastening hole 82 of the fastening plate portion 81 of the terminal 15, and is screwed into the screw hole 75a of the nut 75 accommodated in the nut accommodating recessed portion 67. Accordingly, the bus bar 95 is fastened and connected to the fastening plate portion 81 of the terminal 15 by the bolt 97 and the nut 75. In this fastened state, an end portion of the bolt 97 passes through the counterbore 68 formed in the bottom portion 67a without interfering with the bottom portion 67a of the nut accommodating recessed portion 67.

As illustrated in FIG. 5, in a state in which the terminal block 11 is assembled to the partition wall 1, the housing body 17 is disposed so as to penetrate the attachment hole 2 in the partition wall 1. In the terminal 15, a tip end portion (fastening hole 82) of the fastening plate portion 81 is disposed outside the partition wall 1 (that is, in the air), and a tip end portion (connection hole 86) of the connection plate portion 85 is disposed inside the partition wall 1 (that is, in the oil). The holder 19 has a shape that guides the tip end portion (fastening hole 82) of the fastening plate portion 81 of the terminal 15 toward the bus bar 95, and is assembled to the housing body 17 outside the partition wall 1 (that is, in the air) with respect to the seal member 41 so as to fix the position of the seal member 41.

In the state in which the terminal block 11 is assembled to the partition wall the terminal block 11 electrically relays the terminal fitting 91 positioned inside the partition wall 1 (that is, in oil) and the bus bar 95 positioned outside the partition wall 1 (that is, in air) while preventing leakage of the oil liquid sealed inside the partition wall 1 by the seal member 41 that seals a gap between the terminal 15 and the housing body 17 and the seal member 28 that seals a gap between the partition wall 1 and the housing body 17.

As described above, the housing body 17 is disposed so as to penetrate the attachment hole 2 in the partition wall 1, the housing body 17 is exposed to the oil liquid sealed inside the partition wall 1. On the other hand, since the holder 19 is assembled to the housing body 17 outside the partition wall 1 with respect to the seal member 41, the holder 19 is not exposed to the oil liquid, in view of these points, in the terminal block 11, the housing body 17 is made of a material having better durability to the oil liquid as compared with the holder 19. In general, a material having excellent durability to the oil liquid is more expensive than a material other than the material excellent in durability to the oil liquid. Therefore, a manufacturing cost of the terminal block 11 can be reduced as compared with a case where both the housing body 17 and the holder 19 are made of a material having excellent durability to the oil liquid.

Examples of the material constituting the housing body 17 (the material having excellent durability to the oil liquid) include a syndiotactic polystyrene resin (SPS), polyphenylene sulfide resin (PPS), a polyamide resin, a composition containing a polybutylene terephthalate resin and glass fiber, and a composition containing the polyamide resin and the glass fiber. In general, durability of the material to the oil liquid is improved by mixing the glass fiber with the synthetic resin. However, when the glass fiber is mixed with the synthetic resin, the material tends to be less likely to be elastically deformed (that is, less likely to be bent). In consideration of these points, a content of the glass fiber in the material (that is, synthetic resin+glass fiber) constituting the housing body 17 is preferably 15 to 30 wt %. From another viewpoint, when the terminal block 11 is fitted into the partition wall 1 of a device such as a drive motor, it is necessary to increase a reaction force (holding force) by the seal member 28 in order to withstand a pressure difference between the inside and the outside of the drive motor, and it is preferable to use the polyamide resin (or a composition containing the polyamide resin) excellent in strength in order to cope with the high reaction force.

As the material constituting the holder 19 (that is, the material lower in durability to the oil liquid than the material constituting the housing body 17) a material having a similar composition (that is, the synthetic resin+the glass fiber) to the material constituting the housing body 17 and having a lower content of the glass fiber than the material constituting the housing body 17 may be used.

<Functions and Effects>

As described above, according to the terminal block 11 of the present embodiment, since the housing body 17 is disposed so as to penetrate the partition wall 1, the housing body 17 to be exposed to the oil liquid sealed inside the partition wall 1 is made of the material having better durability to the oil liquid as compared with the holder 19. Since the holder 19 is assembled to the housing body 17 outside the partition wall 1 with respect to the seal member 41, the holder 19 is not exposed to the oil liquid, and the holder does not necessarily have excellent durability to the oil liquid. Accordingly, the manufacturing cost of the terminal block 11 can be reduced as compared with the case where both the housing body 17 and the holder 19 are made of the material having excellent durability to the oil liquid. Therefore, the terminal block 11 according to the present embodiment can reduce the manufacturing cost while improving the durability to the oil liquid.

Further, the nut 75 is accommodated in the holder 19, and the terminal 15 is fastened together with the bus bar 95 by the bolt 97 inserted into the nut 75. Accordingly, the holder 19 cart also be used as a pedestal portion for fastening the bus bar 95 and the terminal 15, and the manufacturing cost of the terminal block 11 can be further reduced as compared with a case where the pedestal portion is provided on a member independent from the holder 19 and the housing body 17. Further, since the holder 19 in which an amount of the resin used during manufacturing is increased by an amount corresponding to the nut accommodating recessed portion 67 is made of a relatively inexpensive resin as described above, the manufacturing cost of the terminal block 11 can be reduced.

Other Embodiments

The present invention is not limited to the above embodiment, and various modifications can be adopted within the scope of the present invention. For example, the present invention is not limited to the above-described embodiment, and modifications, improvements, and the like can be made as appropriate. In addition, materials, shapes, dimensions, numbers, arrangement locations or the like of components in the embodiments described above are optional and are not limited as long as the present invention can be achieved.

In the above embodiment, the housing body 17 is made of a material having better durability to the oil liquid as compared with the holder 19 since the oil liquid is sealed inside the partition wall 1 to which the terminal block 11 is assembled. On the other hand, when water is sealed inside the partition wall 1 to which the terminal block 11 is assembled, the housing body 17 may be made of a material having better durability to water than the holder 19.

Here, features of the embodiment of the terminal block 11 according to the present invention described above will be briefly summarized and listed in [1] to [3] below.

[1] A terminal block (11) configured to electrically relay inside and outside of a partition wall (1) sealing a liquid includes:

a housing (17) disposed so as to penetrate the partition wall (1);

a bus bar (15) inserted into a first through hole (31) of the housing (17);

a seal member (41) attached to the housing (17) so as to seal a gap between the bus bar (15) and the housing (17), and having a seal hole (42) through which the bus bar (15) is inserted; and a holder (19) assembled to the housing (17) at a position outside the partition wall (1) with respect to the seal member (41) so as to prevent the seal member (41) from coming off, and having a second through hole (terminal insertion hole 73) through which the bus bar (15) is inserted, in which the bus bar (15) extends through the first through hole (31), the seal hole (42), and the second through hole (terminal, insertion hole 73) such that one end of the bus bar (15) is disposed inside the partition wall (1) and the other end of the bus bar (15) is disposed outside the partition wall (1), and durability of a material constituting the housing (17) to the liquid is better than durability of a material constituting the holder (19) to the liquid.

According to the terminal block having the configuration of the above [1], since the housing is disposed so as to penetrate the partition wall (for example, an outer wall of a device), the housing to be exposed to the liquid (for example, an oil liquid or water) sealed in the partition wall is made of the material having better durability to the liquid as compared with the bolder. Since the holder is assembled to the housing outside the partition wall with respect to the seal member, the holder is not exposed to the liquid in the partition wall and does not necessarily have the excellent durability to the liquid. By selecting the material constituting the housing and the material constituting the holder separately from each other from a viewpoint of a degree of durability to the liquid, a manufacturing cost of the terminal block can be reduced as compared with a case where both the housing and the holder are made of a material having excellent durability to the liquid as in the related art. Therefore, the terminal block of the present configuration can reduce the manufacturing cost while improving the durability to the liquid to which the terminal block is exposed.

[2] In the terminal block (11) according to the above [1], the holder (19) includes a nut accommodating portion (67) and a nut (75) accommodated in the nut accommodating portion (67), and
the bus bar (15) includes a fastening hole (82) disposed to be aligned with the nut (75), and is electrically connected to an external terminal (95) by being fastened together with the external terminal (95) by a bolt (97) inserted into the fastening hole (82) and fastened to the nut (75).

According to the terminal block having the configuration of the above [2], the nut is accommodated in the nut accommodating portion of the holder, and the bus bar is fastened together with the external terminal by the bolt fastened to the nut. Accordingly, the holder can also be used as a pedestal for fastening the external terminal and the bus bar, and the manufacturing cost of the terminal block can be further reduced as compared with a case where the pedestal is provided on a member independent of the holder and the housing. Further, since the holder in which an amount of resin used at the time of manufacturing increases by an amount corresponding to the nut accommodating portion is made of a relatively inexpensive resin as described above, the manufacturing cost of the terminal block can be reduced.

[3] In the terminal block (11) according to the above [1] or [2],
the liquid sealed in the partition wall (1) is an oil liquid, and
the housing (17) is made of a polyamide resin.

According to the terminal block having the configuration of the above [3], the housing is made of the polyamide resin. The polyamide resin is particularly excellent in durability to the oil liquid. Therefore, the durability of the housing to the oil liquid can be improved.

Further, the embodiment: of the terminal block 11 according to the present invention also has the following features.

A manufacturing method of a terminal block (11) configured to electrically relay inside and outside or a partition wall (1) sealing a liquid, in which the terminal block (11) includes:
a housing (17) disposed so as to penetrate the partition wall (1); a bus bar (15) of which one end is disposed inside the partition wall (1) and the other end is disposed outside the partition wall (1); a seal member (41) configured to seal a gap between the bus bar (15) and the housing (17); and a holder (19) configured to prevent the seal member (41) from coming off, and
durability of a material constituting the housing (17) to the liquid is better than durability of a material constituting the holder (19) to the liquid,
the manufacturing method includes executing in order:
attaching the seal member (41) to the housing (17) such that a first through hole (31) of the housing (17) communicates with a seal hole (42) of the seal member (41);
assembling the holder (19) to the housing (17) at a position outside the partition wall (1) with respect to the seal member (41) such that the seal hole (42) communicates with a second through hole (73) of the holder (19); and
inserting the bus bar (15) through the second through hole (73), the seal to e (42), and the first through hole (31) in order.

According to the manufacturing method of the terminal block having the above configuration, since the bus bar enters the seal hole of the seal member while being guided by the second insertion bole of the holder, it is possible to prevent the bus bar from erroneously coming into contact with a portion other than the seal hole of the seal member and damaging the seal member. By selecting, the material constituting the housing and the material constituting the holder separately from each other from a viewpoint of a degree of durability to the liquid, a manufacturing cost of the terminal block can be reduced.

What is claimed is:
1. A terminal block configured to electrically relay inside and outside of a partition wall sealing a liquid, the terminal block comprising:
a housing disposed so as to penetrate the partition wall;
a bus bar inserted into a first through hole formed in the housing;
a seal member attached to the housing so as to seal a gap between the bus bar and the housing, and having a seal hole through which the bus bar is inserted; and
a holder assembled to the housing at a position outside the partition wall with respect to the seal member so as to prevent the seal member from coming off, and having a second through hole through which the bus bar is inserted,
wherein the bus bar extends through the first through hole, the seal hole, and the second through hole such that one end of the bus bar is disposed inside the partition wall and the other end of the bus bar is disposed outside the partition wall, and
wherein durability of a material constituting the housing to the liquid is better than durability of a material constituting the holder to the liquid.

2. The terminal block according to claim 1,
wherein the holder includes a nut accommodating portion and a nut accommodated in the nut accommodating portion, and
wherein the bus bar includes a fastening, hole disposed to be aligned with the nut, and is electrically connected to an external terminal by being fastened together with the external terminal by a bolt which is inserted into the fastening hole and is fastened to the nut.

3. The terminal block according to claim 1,
wherein the liquid sealed in the partition wall is an oil liquid, and
wherein the housing, is made of a polyimide resin.

4. A manufacturing method of the terminal block configured to electrically relay inside and outside of a partition wall sealing a liquid,
the terminal block includes
a housing disposed so as to penetrate the partition wall;
a bus bar of which one end is disposed inside the partition wall and the other end is disposed outside the partition wall;

a seal member configured to seal a gap between the bus bar and the housing; and a holder configured to prevent the seal member from coming off, and durability of a material constituting the housing to the liquid is better than durability of a material constituting the holder to the liquid, the manufacturing method comprising attaching the seal member to the housing such that a first through hole formed in the housing communicates with a seal hole formed in the seal member;

assembling the holder to the housing at a position outside the partition wall with respect to the seal member such that the seal hole communicates with the second through hole of the holder; and inserting the bus bar through the second through hole, the seal hole, and the first through hole in order.

* * * * *